United States Patent
Katayama

(10) Patent No.: US 6,903,374 B2
(45) Date of Patent: Jun. 7, 2005

(54) STRUCTURE OF P-ELECTRODE AT THE LIGHT-EMERGING SIDE OF LIGHT-EMITTING DIODE

(75) Inventor: Koji Katayama, Osaka (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/457,575

(22) Filed: Jun. 9, 2003

(65) Prior Publication Data
US 2004/0012013 A1 Jan. 22, 2004

(30) Foreign Application Priority Data
Jul. 17, 2002 (JP) ......................... 2002-208105

(51) Int. Cl.[7] ................. H01L 27/15; H01L 29/12
(52) U.S. Cl. .................. 257/79; 257/79; 257/99; 257/81; 257/102; 257/130; 257/613; 257/615
(58) Field of Search ................. 257/79, 99, 81, 257/102, 130, 613, 615

(56) References Cited

U.S. PATENT DOCUMENTS

| | | | |
|---|---|---|---|
| 5,767,534 A | * 6/1998 | Chien et al. | 257/91 |
| 5,909,459 A | 6/1999 | Ishibashi et al. | |
| 6,291,839 B1 | 9/2001 | Lester | |
| 6,420,732 B1 | * 7/2002 | Kung et al. | 257/79 |
| 6,512,248 B1 | * 1/2003 | Takeuchi et al. | 257/81 |
| 2002/0063256 A1 | * 5/2002 | Lin | 257/79 |

FOREIGN PATENT DOCUMENTS

| | | |
|---|---|---|
| JP | 2000082845 A | 3/2000 |
| JP | 2000174339 A | 6/2000 |
| JP | 2000216431 A | 8/2000 |
| JP | 2001015812 A | 1/2001 |
| JP | 2001148511 A | 5/2001 |
| JP | 2001-148511 | 5/2001 |
| WO | WO 01/9114 | 11/2001 |
| WO | WO 01/91194 A1 | 11/2001 |

OTHER PUBLICATIONS

Yamada et al. (2002) "InGaN–Based Near–Ultraviolet and Blue–Light–Emitting Diodes with High External Quantum Efficiency Using a Patterned Sapphire Substrate and a Mesh Electrode", Jpn. J. Appl. Phys. 41:L1431–1433.

F. Nakanishi, et al., Low–threshold room–temperature CW operation of ZnSe–based blue/green laser diodes grown on conductive ZnSe substrates; *Electronics Letters;* vol. 34, No. 5 (1998).

\* cited by examiner

*Primary Examiner*—Allan R. Wilson
*Assistant Examiner*—Joseph Nguyen
(74) *Attorney, Agent, or Firm*—Fish & Richardson P.C.

(57) ABSTRACT

A structure of a p-electrode formed at the light-emerging side of an LED that comprises (a) an n-type semiconductor substrate, (b) an n-type cladding layer, an active layer, a p-type cladding layer, and a p-type contact layer formed on the substrate in this order, and (c) an n-electrode formed on the back face of the substrate. The structure of the p-electrode comprises a mesh-shaped semi-transparent thin-film metal electrode for diffusing electric current formed on the p-type contact layer and a bonding electrode for wire bonding. The metal electrode comprises a covering portion having a transmittance of at least 10% and an opening portion having an opening ratio of at least 20%. The bonding electrode is formed at the periphery of the p-type contact layer and is bonded directly to the mesh-shaped semi-transparent thin-film metal electrode. This structure can increase the intensity of the output light emerging from the p-side.

10 Claims, 7 Drawing Sheets

STRUCTURE OF P-ELECTRODE AT THE LIGHT-EMERGING SIDE OF LIGHT-EMITTING DIODE

BACKGROUND OF THE INVENTION

1. Field of the Invention

The present invention relates to a structure of a p-electrode at the light-emerging side of a light-emitting diode, and particularly to a structure of the p-electrode improved so as not to obstruct the passing of light in a light-emitting diode using a wide-bandgap semiconductor such as ZnSe or GaN.

2. Description of the Background Art

A light-emitting diode (hereinafter referred to as LED) has an n-electrode on one of the two main surfaces (top and bottom surfaces) and a p-electrode on the other. In the case of a surface-illuminating-type LED, either surface is used as the light-emerging surface. The electrode, usually made of metal, is required not to obstruct the passing of light.

An LED such as an AlGaAs-based LED has a structure in which a p-type GaAs contact layer, having a sufficient electrical conductivity, is placed on the pn junction, and a small-area dot- or ring-shaped p-electrode is placed on the contact layer. In this specification, the narrow p-electrode is also called a bonding electrode because it is used for wire bonding.

Because the p-type GaAs contact layer has low resistance, it has the ability to diffuse a current injected from the small-area p-electrode, making the current density nearly uniform under the contact layer. In other words, the p-type GaAs contact layer desirably functions as a current-diffusing layer. Therefore, when the narrow bonding electrode is formed on the p-type contact layer, this simple structure can sufficiently diffuse the current.

However, when an LED is produced by using a material that makes it difficult to obtain a low-resistance p-type semiconductor, the semiconductor itself cannot sufficiently diffuse the current. With a GaN- or ZnSe-based wide-bandgap semiconductor, it is difficult to produce a p-type semiconductor, particularly a low-resistance p-type semiconductor. This is the reason why an LED using such a semiconductor has difficulty in obtaining a low-resistance p-type contact layer. As a result, the LED cannot be provided with a current-diffusing layer.

With an LED having no current-diffusing layer, the bonding electrode for wire bonding alone cannot diffuse the current sufficiently in the p-type contact layer. Consequently, the current is localized at the portion underneath the electrode. As a result, the effective area of the light-emitting section is decreased, notably decreasing the luminous efficiency. In addition, the current crowding decreases the life of the LED. To prevent the current concentration at the portion directly under or in the vicinity of the bonding electrode, an LED having no current-diffusing layer usually has a structure in which an extremely thin semi-transparent metal electrode made of Au, for example, is formed on the entire surface of the light-emitting region. In this structure, the bonding electrode is placed on a portion of the light-emitting region. Au can provide ohmic contact with the p-type contact layer.

In this specification, the thin metal electrode is referred to as "a semi-transparent thin-film metal electrode" to distinguish it from the bonding electrode. In other words, the p-electrode has a dual structure composed of the bonding electrode and the semi-transparent thin-film metal electrode. Whereas the bonding electrode does not transmit light, the semi-transparent thin-film metal electrode can transmit light to a certain extent. Consequently, light generated at the pn junction can pass through the semi-transparent thin-film metal electrode to exit to the outside.

However, although the semi-transparent thin-film metal electrode covering the entire p-type contact layer can transmit light, its transmittance is low. As a result, in a GaN- or ZnSe-LED, part of the upward light emitted from the active layer is absorbed or reflected by the semi-transparent thin-film metal electrode. The axial light intensity decreases by the amount of the absorption and reflection losses.

The absorption and reflection at the semi-transparent thin-film metal electrode decreases the amount of light emerging from the LED to the outside, decreasing the brightness accordingly. To increase the light intensity (brightness), it is necessary to decrease the absorption and reflection at the semi-transparent thin-film metal electrode. In other words, it is necessary to increase the transmittance of the metal electrode. To achieve this purpose, the thickness of the metal electrode can be decreased. However, if the metal electrode is excessively thin, the electrical resistance in the lateral direction increases, decreasing the effect of current diffusion by the metal electrode. For example, when Au is used as the metal electrode, if the thickness is decreased to 5 nm, a sufficient current cannot flow into the Au electrode due to the increased resistance. It is desirable that the Au electrode has a thickness of at least 10 nm, preferably about 20 nm. Although thin, the Au electrode having a thickness of about 20 nm has a transmittance as low as 40% to 60% or so. In other words, about half the amount of the light is decreased by the presence of the Au electrode.

The published Japanese patent application Tokukai 2001-148511, entitled "Semiconductor light-emitting diode," has disclosed a mesh-shaped electrode structure of an LED in which (a) a mesh-shaped metal electrode is formed on the n-type contact layer, (b) a transparent, electrically conductive oxide electrode layer made of indium tin oxide (hereinafter referred to as ITO) is formed on the mesh-shaped metal electrode, and (c) a bonding electrode is formed at the center of the oxide electrode layer (the bonding electrode is referred to as a pad electrode in Tokukai 2001-148511). In other words, the n-side electrode structure is composed of the bonding electrode, the ITO layer, the mesh-shaped metal electrode, and the n-type contact layer.

ITO provides ohmic contact with the n-type contact layer. An injected current sufficiently diff-uses through the thick ITO layer and proceeds into the n-type contact layer with a uniform distribution. Because the ITO layer has an enough thickness, it has the ability to diffuse the current. Therefore, the semiconductor layer (n-type contact layer) is not required to diffuse the current.

Although electrically conductive, ITO is less conductive than Au. Consequently, the transparent electrode is as thick as 600 nm to 1 $\mu$m. Because the ITO is less conductive, the bonding electrode must be placed at the center of the ITO layer in order to obtain the uniform current distribution throughout the chip. If the bonding electrode is placed at a portion close to the periphery of the ITO layer, the current will not flow sufficiently at the opposite portion.

The GaN-LED provided with the ITO transparent electrode without using a mesh-shaped metal electrode has a problem in that the junction barrier between the ITO electrode and the n-type contact layer (n-GaN) is so high that the forward voltage drop becomes as high as seven volts. As a result, a low-voltage drive cannot be performed.

In the structure disclosed in the foregoing Tokukai 2001-148511, the mesh-shaped metal electrode (Au/Ge) is placed on the peripheral portion of the n-type contact layer excluding the central portion for placing the bonding electrode. With the above-described GaN-LED having no mesh-shaped metal electrode, because the current flows directly from the ITO layer to the n-GaN contact layer, the voltage drop becomes as high as seven volts. On the other hand, in the case of the above-described structure disclosed by Tokukai 2001-148511, the current first flows from the ITO layer to the mesh-shaped metal electrode producing no voltage drop, and then flows from the mesh-shaped metal electrode to the semiconductor layer (n-GaN contact layer) producing a voltage drop of no more than about three volts.

As explained above, in the structure disclosed in the Tokukai 2001-148511, the current flows in order of the bonding electrode, the ITO layer, the mesh-shaped metal electrode, and the n-type contact layer. The n-electrode is placed at the side from which the light emerges. As opposed to this, as in the present invention, there is a structure in which the p-electrode is placed at the side from which the light emerges. The n-type contact layer sufficiently absorbs dopants, increasing the carrier density. This high carrier density sufficiently reduces the resistance, facilitating the current diffusion. However, this process cannot be applied to the p-type contact layer aimed at by the present invention, for example.

Consequently, researchers and engineers are required to develop a surface-illuminating-type LED causing the light to exit through the p-electrode, particularly an LED using a wide-bandgap semiconductor such as ZnSe or GaN, in such a way that the LED has an improved light transmittance at the p-electrode in contact with the p-type contact layer to increase the optical output.

SUMMARY OF THE INVENTION

An object of the present invention is to offer an improved structure of the p-electrode in contact with a p-type contact layer of an LED. The improvement is to be attained by increasing the light transmittance of the p-electrode in order to increase the optical output of the LED.

According to the present invention, the foregoing object is attained by offering a structure of a p-electrode formed at the light-emerging side of an LED comprising the following members:

(a) an n-type semiconductor substrate;
(b) an n-type cladding layer formed on the n-type semiconductor substrate;
(c) an active layer formed on the n-type cladding layer;
(d) a p-type cladding layer formed on the active layer;
(e) a p-type contact layer formed on the p-type cladding layer; and
(f) an n-electrode formed on the back face of the n-type semiconductor substrate.

The structure of the p-electrode comprises a mesh-shaped semi-transparent thin-film metal electrode for diffusing electric current formed on the p-type contact layer and a bonding electrode for wire bonding. The metal electrode has (a) a covering portion having a transmittance of at least 10% and (b) an opening portion being formed of a multitude of windows and having an opening ratio of at least 20%. The bonding electrode is formed at the periphery of the p-type contact layer and is bonded directly to the mesh-shaped semi-transparent thin-film metal electrode.

The above-described LED may further comprise an n-type buffer layer between the n-type semiconductor substrate and the n-type cladding layer. The above-described LED may further comprise a p-type semiconductor layer between the p-type cladding layer and the p-type contact layer. The above-described LED may further comprise both (a) an n-type buffer layer between the n-type semiconductor substrate and the n-type cladding layer and (b) a p-type semiconductor layer between the p-type cladding layer and the p-type contact layer.

The foregoing LED having the n-type buffer layer may have the following structure:

(a) the n-type semiconductor substrate is an n-type ZnSe substrate;
(b) the n-type buffer layer is an n-ZnSe buffer layer;
(c) the n-type cladding layer is an n-ZnMgSSe cladding layer;
(d) the active layer is a ZnCdSe/ZnSe multiple quantum well (hereinafter referred to as MQW) active layer or a ZnSeTe active layer;
(e) the p-type cladding layer is a p-ZnMgSSe cladding layer; and
(f) the p-type contact layer comprises a p-(ZnTe/ZnSe) MQW layer and a p-ZnTe layer formed on the p-(ZnTe/ZnSe) MQW layer.

The foregoing LED having both the n-type buffer layer and the p-type semi-conductor layer may have the following structure:

(a) the n-type semiconductor substrate is an n-type ZnSe substrate;
(b) the n-type buffer layer is an n-ZnSe buffer layer;
(c) the n-type cladding layer is an n-ZnMgSSe cladding layer;
(d) the active layer is a ZnCdSe/ZnSe MQW active layer or a ZnSeTe active layer;
(e) the p-type cladding layer is a p-ZnMgSSe cladding layer;
(f) the p-type semiconductor layer is a p-ZnSe layer; and
(g) the p-type contact layer comprises a p-(ZnTe/ZnSe) MQW layer and a p-ZnTe layer formed on the p-(ZnTe/ZnSe) MQW layer.

The foregoing LED may have the following structure:

(a) the n-type semiconductor substrate is an n-GaN substrate;
(b) the n-type cladding layer is an n-GaN cladding layer;
(c) the active layer is an InGaN active layer;
(d) the p-type cladding layer is a p-AlGaN cladding layer; and
(e) the p-type contact layer is a p-GaN contact layer.

The foregoing LED having the n-type buffer layer may also have the following structure:

(a) the n-type semiconductor substrate is an n-GaN substrate;
(b) the n-type buffer layer is an n-GaN buffer layer;
(c) the n-type cladding layer is an n-GaN cladding layer;
(d) the active layer is an InGaN active layer;
(e) the p-type cladding layer is a p-AlGaN cladding layer; and
(f) the p-type contact layer is a p-GaN contact layer.

The foregoing LED having both the n-type buffer layer and the p-type semi-conductor layer may also have the following structure:

(a) the n-type semiconductor substrate is an n-GaN substrate;

(b) the n-type buffer layer is an n-GaN buffer layer;

(c) the n-type cladding layer is an n-GaN cladding layer;

(d) the active layer is an InGaN active layer;

(e) the p-type cladding layer is a p-AlGaN cladding layer;

(f) the p-type semiconductor layer is a p-GaN layer; and (g) the p-type contact layer is a p-GaN contact layer.

According to one aspect of the present invention, a structure of a p-electrode is formed at the light-emerging side of an LED comprising the following members:

(a) a sapphire substrate;

(b) an n-type cladding layer formed on the sapphire substrate;

(c) an active layer formed on the n-type cladding layer;

(d) a p-type cladding layer formed on the active layer;

(e) a p-type contact layer formed on the p-type cladding layer; and (f) an n-electrode formed such that after a certain portion of the epitaxially grown layer of the p-type contact layer, the p-type cladding layer, and the active layer including a surface portion of the n-type cladding layer is removed by etching to expose part of the n-type cladding layer, the n-electrode is formed on the exposed part of the n-type cladding layer.

In this aspect also, the structure of the p-electrode comprises a mesh-shaped semi-transparent thin-film metal electrode for diffusing electric current formed on the p-type contact layer and a bonding electrode for wire bonding. The metal electrode has (a) a covering portion having a transmittance of at least 10% and (b) an opening portion being formed of a multitude of windows and having an opening ratio of at least 20%. The bonding electrode is formed on a peripheral portion of the p-type contact layer and is bonded directly to the mesh-shaped semi-transparent thin-film metal electrode.

In this aspect, the LED may further comprise an n-type buffer layer between the sapphire substrate and the n-type cladding layer. The LED may further comprise a p-type semiconductor layer between the p-type cladding layer and the p-type contact layer. The LED may further comprise both (a) an n-type buffer layer between the sapphire substrate and the n-type cladding layer and (b) a p-type semiconductor layer between the p-type cladding layer and the p-type contact layer.

In this aspect, the LED having the n-type buffer layer may have the following structure:

(a) the n-type buffer layer is an n-GaN buffer layer;

(b) the n-type cladding layer is an n-GaN cladding layer;

(c) the active layer is an InGaN active layer;

(d) the p-type cladding layer is a p-AlGaN cladding layer; and (e) the p-type contact layer is a p-GaN contact layer. In this aspect, the LED having both the n-type buffer layer and the p-type semiconductor layer may have the following structure:

(a) the n-type buffer layer is an n-GaN buffer layer;

(b) the n-type cladding layer is an n-GaN cladding layer;

(c) the active layer is an InGaN active layer;

(d) the p-type cladding layer is a p-AlGaN cladding layer;

(e) the p-type semiconductor layer is a p-GaN layer; and (f) the p-type contact layer is a p-GaN contact layer.

The present invention offers a structure of a p-electrode for a wide-bandgap ZnSe- or GaN-LED, which has low p-type conductivity because of the difficulty in doping p-type impurities. The p-electrode comprises a mesh-shaped semi-transparent thin-film metal electrode for diffusing electric current and a bonding electrode for wire bonding. The metal electrode has a covering portion and an opening portion formed of a multitude of windows. The bonding electrode is formed at the periphery of the p-type contact layer. An injected current flows from the bonding electrode through the meshed thin-film metal electrode to the p-type contact layer. The current is diffused at the metal electrode uniformly including the peripheral portion, so that a uniform current distribution is achieved throughout the LED. Being the meshed structure, the metal portion of the metal electrode does not cover the entire surface of the p-type contact layer. Consequently, the absorption of the outgoing light by the metal electrode can be decreased. In addition, the metal portion constituting the covering portion is thin and transmits light, and the opening portion is increased. As a result, the output efficiency of the light emerging from the LED is increased, and it becomes possible to offer a highly bright LED.

According to the present invention, the p-electrode of an LED has the following structure:

(a) a mesh-shaped thin-film metal electrode having an opening portion composed of a multitude of windows and a covering portion composed of a thin metal film is placed on the entire surface of the p-type contact layer; and (b) the metal electrode is directly bonded to a bonding electrode for wire bonding placed at the periphery of the p-type contact layer.

Light generated at the pn junction passes through the opening portion or the covering portion to exit to the outside. Some part of the outgoing light passes through the covering portion having an ordinary transmittance. The transmittance is at least 10%. The remaining part of the outgoing light passes through the opening portion without any loss (transmittance: 100%), increasing the output efficiency of the outgoing light.

According to the present invention, in the structure of the p-electrode:

(a) the circumscribed circle of each window of the opening portion in the mesh-shaped semi-transparent thin-film metal electrode may have a diameter, L, of at most 100 $\mu$m;

(b) the covering portion of the metal electrode may have a thickness, d, of at least 10 nm and at most 60 nm; and (c) the opening portion of the metal electrode may have an opening ratio of 30% to 90%.

In a surface-illuminating-type LED using a wide-bandgap semiconductor such as ZnSe or GaN and causing light to emerge from the p-electrode side, the p-type contact layer has high resistance and therefore it is difficult to diffuse electric current. Notwithstanding this difficulty, an LED having an increased output of light can be offered by increasing the light transmittance through the improvement of the p-electrode in contact with the p-type contact layer without relying on ITO.

In the improved p-electrode, however, the opening portion does not make contact with the p-type contact layer. This creates the possibility of insufficient diffusion of the current in the p-type contact layer and the accompanying decrease in luminous efficiency. The current can be sufficiently diffused when the p-type contact layer has a sufficiently low resistance and the window is sufficiently narrow. In this respect, it is desirable that the window be narrower. More specifically, as described above, it is desirable that the circumscribed circle of the window have a diameter of at most 100 μm. On the other hand, if the window is excessively narrow, the increment of the outgoing light is decreased.

As described above, according to the present invention, the structure of the p-electrode formed at the light-emerging side of an LED is effective in increasing the output efficiency of the light emerging from the LED. This effectiveness is particularly remarkable in an LED using a wide-bandgap semiconductor such as ZnSe or GaN.

Figure 1:
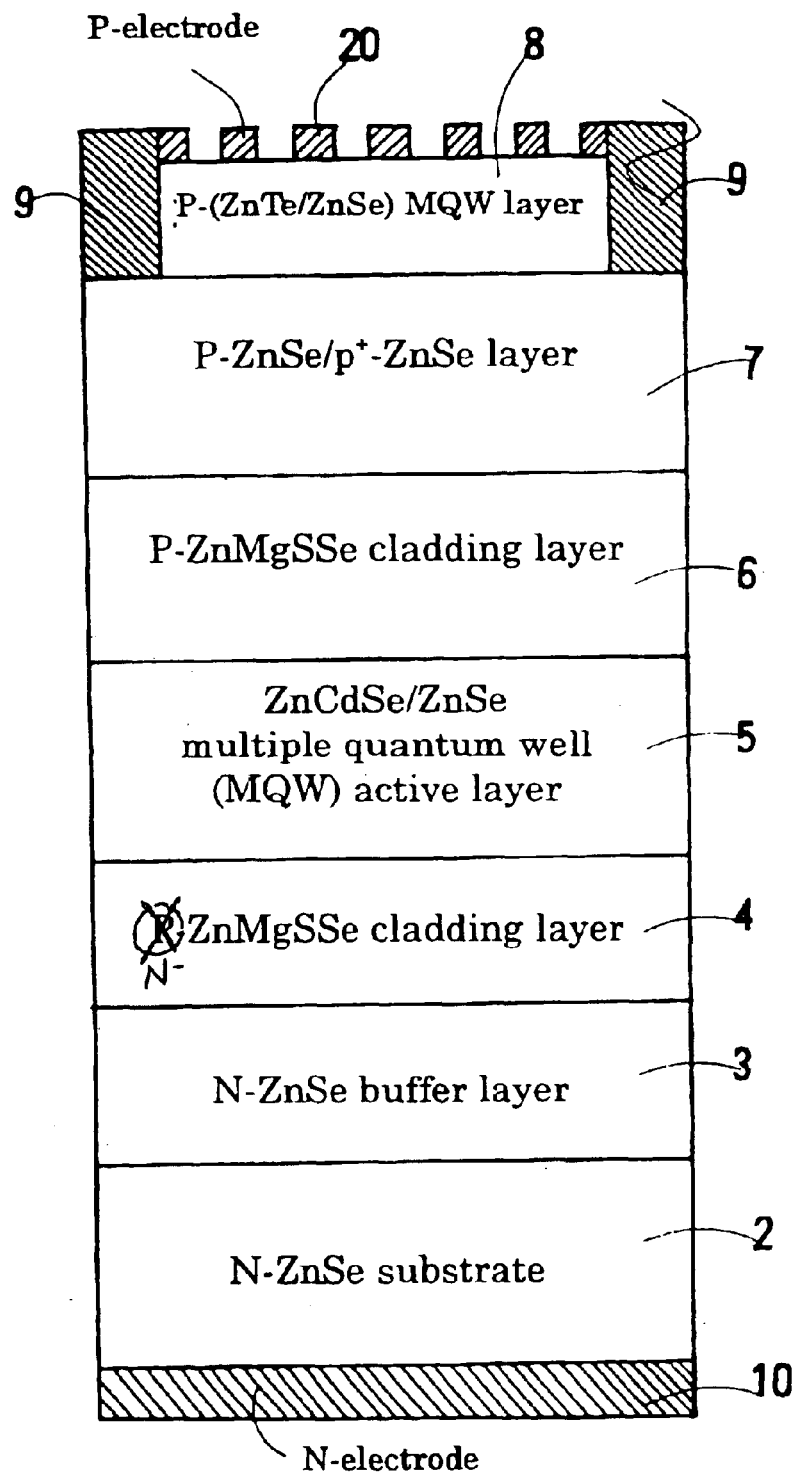
FIG. 1 is a vertical cross section of the structure employed in Example 1 in which a ZnSe-LED has the following structure.

(a) the following layers are formed on an n-type ZnSe substrate: an n-ZnSe buffer layer, an n-ZnMgSSe cladding layer, an ZnCdSe/ZnSe MQW active layer, a p-ZnMgSSe cladding layer, a p-ZnSe/p$^+$-ZnSe layer, a p-(ZnTe/ZnSe) MQW layer, and a p-ZnTe layer (not shown in FIG. 1);

(b) an n-electrode is formed on the back face of the n-type ZnSe substrate; and (c) the mesh-shaped Au p-electrode of the present invention is formed on the p-type contact layer composed of the p-(ZnTe/ZnSe) MQW layer and the p-ZnTe layer.

Figure 2:
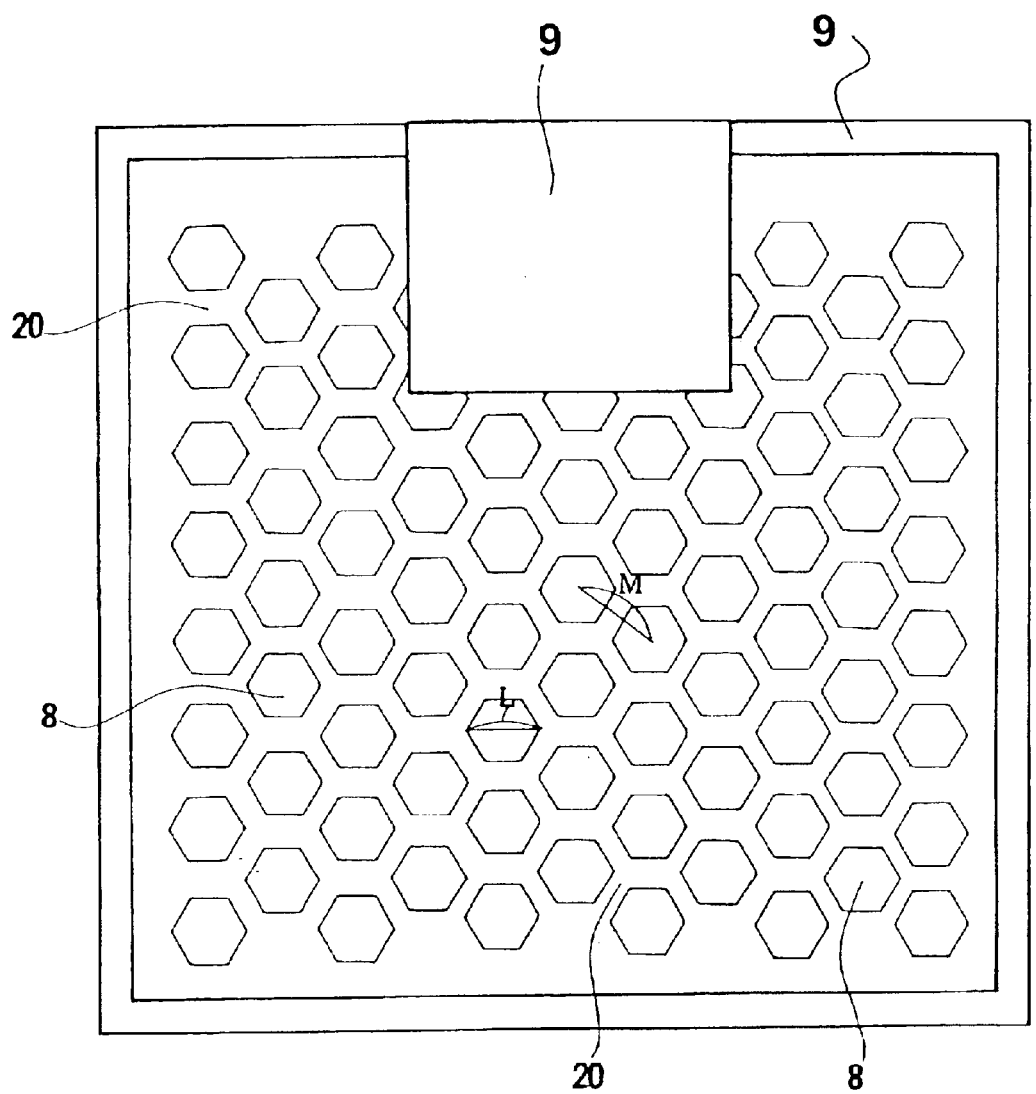

FIG. 2 is a plan view of a structure employed in Example 1 in which a ZnSe-LED is provided on its p-type contact layer with a mesh-shaped p-electrode having a multitude of regular hexagonal windows arranged in six-fold symmetry.

Figure 3:
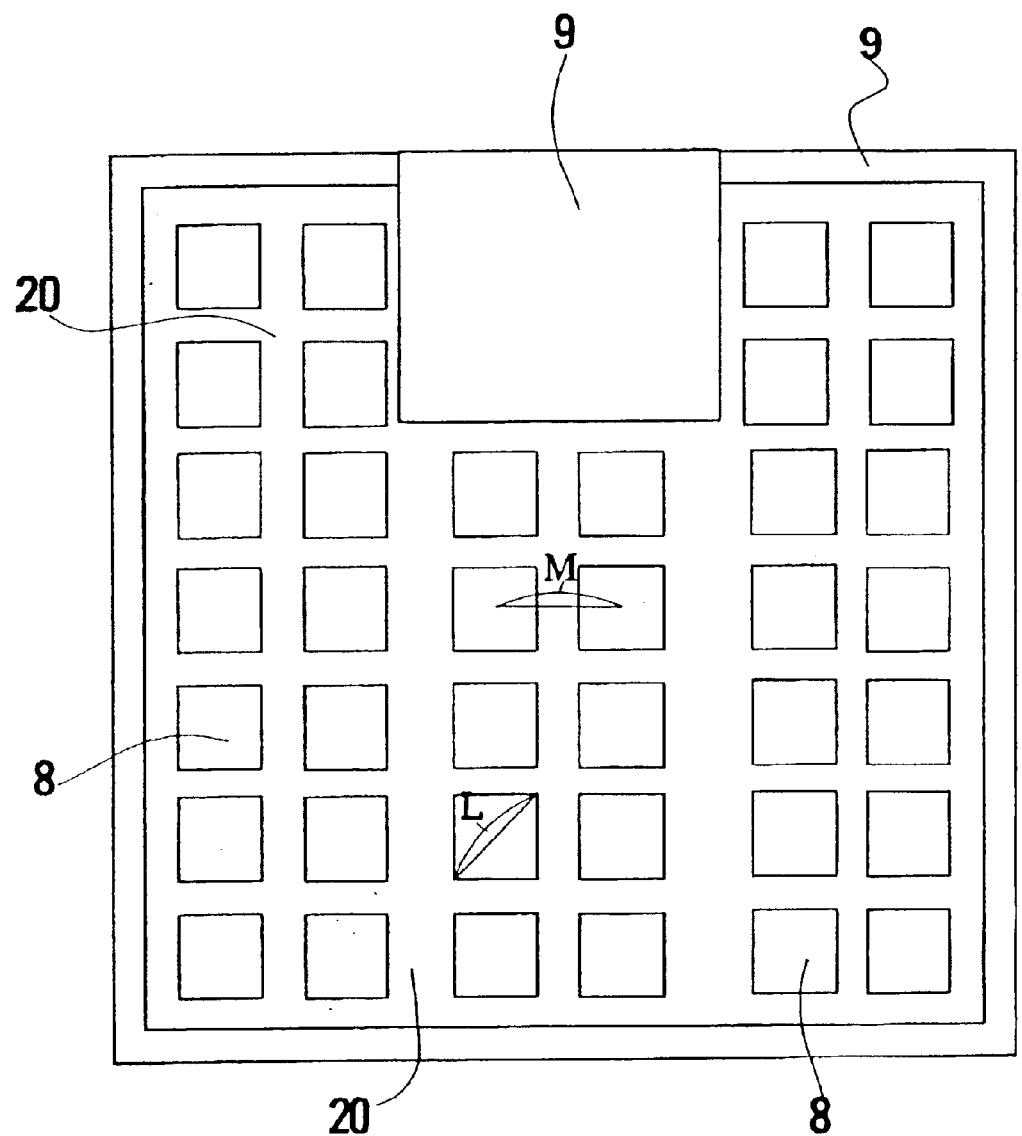

FIG. 3 is a plan view of another structure employed in Example 1 in which a ZnSe-LED is provided on its p-type contact layer with a mesh-shaped p-electrode having a multitude of square windows arranged in four-fold symmetry.

Figure 4:
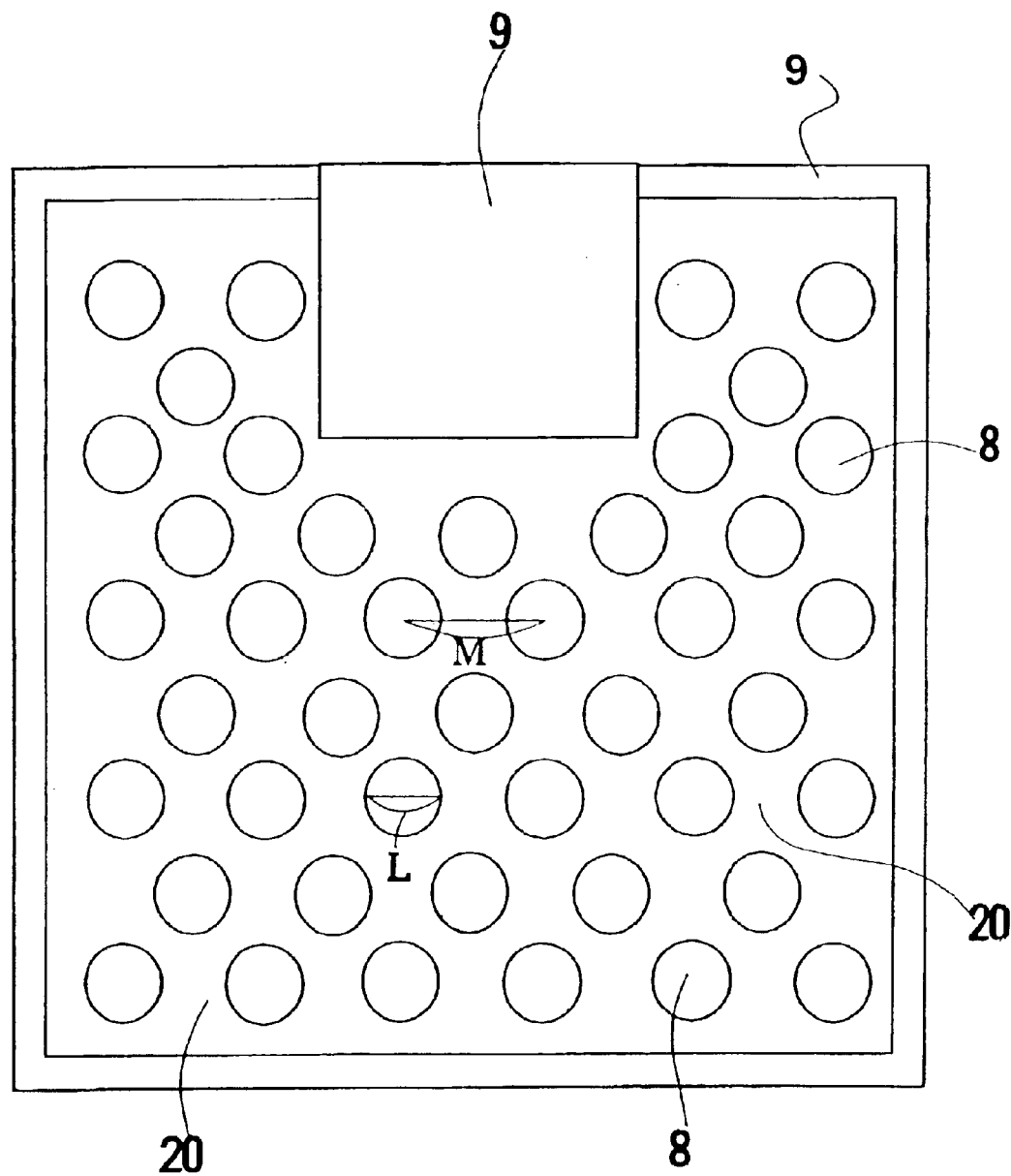

FIG. 4 is a plan view of yet another structure employed in Example 1 in which a ZnSe-LED is provided on its p-type contact layer with a mesh-shaped p-electrode having a multitude of circular windows arranged in four-fold symmetry.

Figure 5:
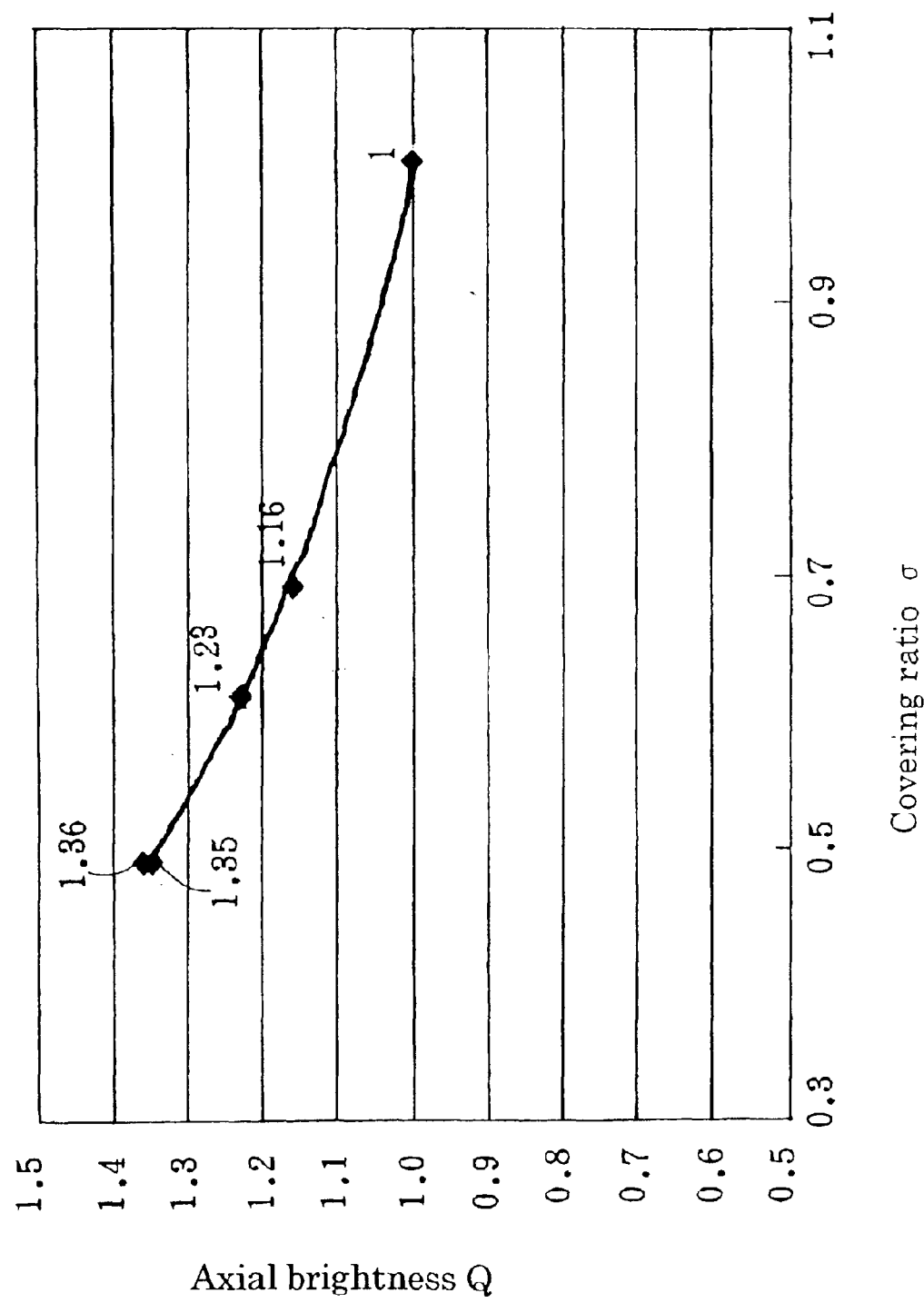

FIG. 5 is a graph showing a measured relationship between the covering ratio σ of the mesh-shaped Au electrode and the axial brightness Q of the ZnSe-LED produced in Example 1 in which the ZnSe-LED is provided on its p-type contact layer with a mesh-shaped Au p-electrode, wherein the axis of abscissas represents the covering ratio σ and the axis of ordinates represents the axial brightness Q (when the contact layer is totally covered with the electrode (σ=1), the axial brightness takes a value of 1 as a reference).

Figure 6:
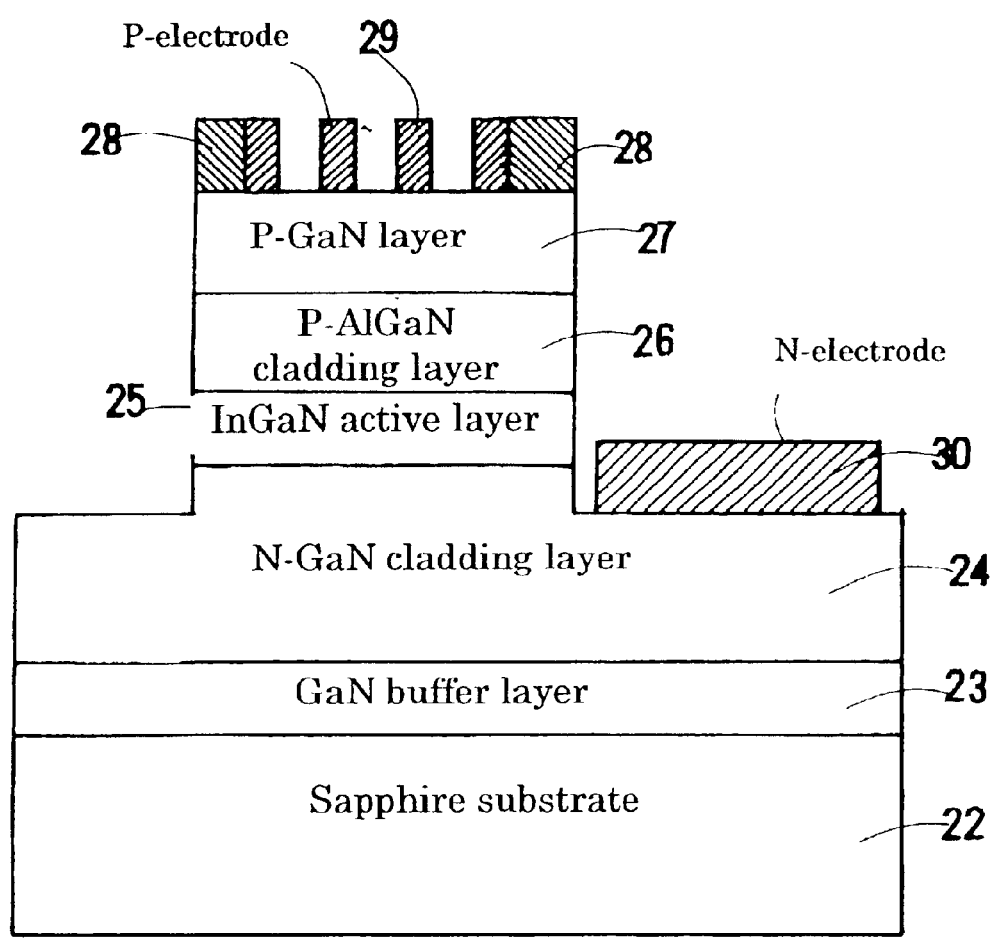

FIG. 6 is a vertical cross section of the structure employed in Example 2 in which a GaN-LED has the following structure:

(a) the following layers are formed on a sapphire substrate (an insulating material): a GaN buffer layer, an n-GaN cladding layer, an InGaN active layer, a p-AlGaN cladding layer, and a p-GaN layer;

(b) after a certain portion of the laminated layer of the p-GaN layer, the p-AlGaN cladding layer, and the InGaN active layer including a surface portion of the n-GaN cladding layer is remove by etching to expose part of the n-GaN cladding layer, an n-electrode is formed on the exposed part of the n-GaN cladding layer; and (c) the mesh-shaped Ni/Au p-electrode of the present invention is formed on the p-type contact layer (the p-GaN layer).

Figure 7:
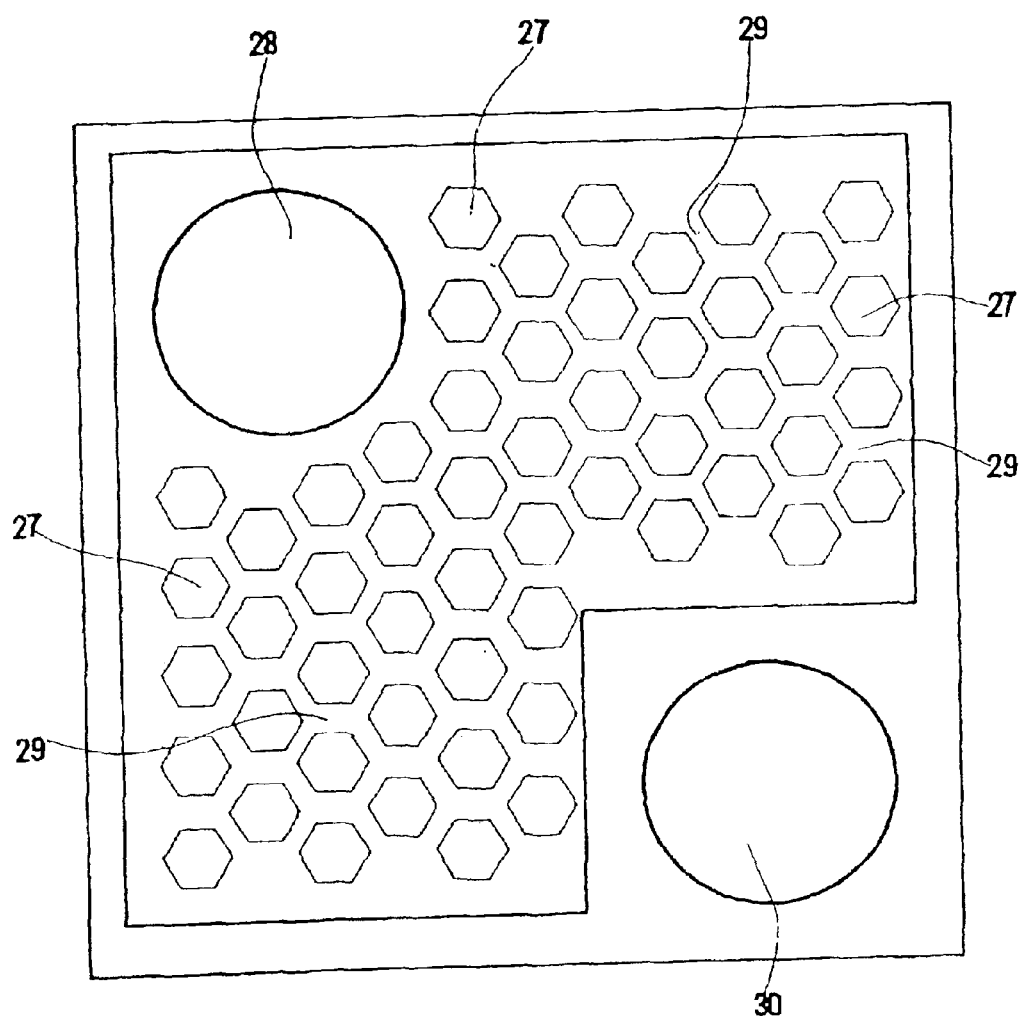

FIG. 7 is a plan view of a structure employed in Example 2 in which a GaN-LED is provided on its p-type contact layer with a mesh-shaped p-electrode having a multitude of regular hexagonal windows arranged in six-fold symmetry.

DETAILED DESCRIPTION OF THE INVENTION

Embodiments of the present invention are explained below by referring to the accompanying drawings. In the drawings, the same number or sign refers to the same element to avoid duplicated explanation. The ratios of the dimensions in the drawings do not necessarily coincide with the explanation.

[a. Material for the Light-emitting Element]

The present invention aims at improving an LED that uses ZnSe or GaN, which has a wide bandgap and even when sufficiently doped with impurities, shows high resistivity because of the shortage of charge carriers.

[b. Shape of the Electrode]

The present invention aims to improve the shape of the p-electrode from which the light emerges.

[c. P-type Contact Layer]

With a wide-bandgap semiconductor such as ZnSe or GaN, the doping of p-type impurities is not easy. Even if the doping is satisfactorily performed, the activation rate is low, and not many positive holes are excited from the acceptor in many cases. As a result, the p-type carrier is scarce in number, and a current injected from the narrow p-electrode cannot diffuse sufficiently at the p-type contact layer. In the p-type contact layer, the current is localized at the portion directly under the p-electrode. To improve this situation, the mesh-shaped thin-film metal electrode of the present invention is placed on the p-type contact layer, such as a p-ZnSe, p-ZnTe, p-BeTe, p-GaN, or p-AlGaN contact layer.

[d. Covering Ratio σ of the Thin-film Electrode]

In a conventional ZnSe-LED, the entire surface of the p-type contact layer is covered with a semi-transparent thin-film electrode. According to the present invention, the covering ratio σ is not 1 but expressed as 0<σ<1. The transmittance β of the covering portion varies with the thickness d of the thin-film electrode, and hence is denoted as β(d). In the present invention, the thickness d is similar to that in the conventional LED. Consequently, when the thickness is the same, the covering portion, whose covering ratio is σ, has the same transmittance β(d) as in the conventional LED. Unlike the conventional LED, the thin-film electrode of the present invention has an opening portion. The opening portion, whose ratio is 1−σ, has a transmittance of 1.

The presence of the opening portion, however, may create insufficient diffusion of the current. The current diffusion at the p-type contact layer is affected by the presence of the opening portion. The current-diffusing power of the p-type contact layer is denoted by γ, which takes a value of 0 to 1. As the diameter L of the circumscribed circle of the window of the opening increases, the current-diffusing power γ decreases. Hence, the current-diffusing power can be expressed as γ(L). When the transmittance of the outgoing light at the p-electrode is denoted by T, the transmittance $T_1$ for the conventional method can be expressed by equation (1).

$$T_1 = \beta(d) \tag{1}$$

On the other hand, the transmittance $T_2$ for the present invention can be expressed by equation (2).

$$T_2 = \beta(d)\sigma + (1-\sigma)\gamma(L) \tag{2}$$

From the two equations, equation (3) can be derived.

$$T_2/T_1 = \gamma(L)/\beta(d) + \{1 - \gamma(L)/\beta(d)\}\sigma \quad (3)$$

$$= 1 + \{\gamma(L)/\beta(d) - 1\}(1-\sigma).$$

If $T_2/T_1$ is smaller than 1, the conventional method is superior to the method of the present invention. $\gamma(L)$ is close to 1 but not necessarily larger than $\beta(d)$. According to equation (3) the present invention is effective when $\beta(d)$ is small (when the thin-film metal electrode has low transmittance). More specifically, the present invention is effective when the covering ratio $\sigma$ is less than about 0.8 (the opening ratio is more than about 0.2). As described in Example 1 below, when the covering ratio is about 0.7 (the opening ratio is about 0.3), the amount of the output light is increased by at least 10%.

[e. Repetitive Pattern of the Window of the Opening Portion of the Thin-film Metal Electrode]

The meshed pattern of the thin-film electrode can be produced by forming a multitude of windows. An irregular pattern can be used. A regular pattern, also, can be used, in which the same pattern is repeated. For example, it is possible to use a six-fold rotationally symmetrical pattern, a four-fold rotationally symmetrical pattern, or a two-fold rotationally symmetrical pattern. In these three patterns, the shape of the window can be any type, such as a regular hexagon, a square, a circle, or an ellipse.

The photolithography can produce any type of the thin-film metal electrode pattern with the same easiness. When the opening ratio $(1-\sigma)$ is specified (this automatically determines the covering ratio $\sigma$), a pattern that easily satisfies the specification can be used. The process for obtaining the opening ratio $(1-\sigma)$ in accordance with the symmetry and the shape of the window is explained below.

[f. Six-fold Rotationally Symmetrical Pattern (FIGS. 2 and 7)]

In a six-fold rotationally symmetrical pattern, the distance between the centers of the neighboring windows is denoted by M. The area of the triangle produced by the centers of the neighboring three windows is expressed as $3^{1/2}M^2/4$. The shape of the window is not limited to a regular hexagon. A circle or square can be used. FIGS. 2 and 7 show a pattern in which the window has the shape of a regular hexagon. In this case, the symmetry of the arrangement of the windows coincides with the symmetry of the shape of the window. Consequently, when the circumscribed circle of the window has a diameter of $L=2M/3^{1/2}$, the opening ratio is 1. The ratio L/M determines the opening ratio $(1-\sigma)$ as shown in equation (4).

$$(1-\sigma)(\text{regular hexagonal window}) = (\tfrac{3}{4})(L^2/M^2) \quad (4)$$

The value of $(1-\sigma)$ varies from 0 to 1. Hence, $$0 \leq (1-\sigma)(\text{regular hexagonal window}) \leq 1 \quad (5).$$

In the case of a square window, although the windows can be formed at the places arranged in six-fold symmetry, the entire pattern cannot be in six-fold symmetry because of the nature of the square shape. The window has an area of $L^2/2$, where L is the diameter of the circumscribed circle of the square. Therefore, the opening ratio $(1-\sigma)$ is expressed by equation (6).

$$(1-\sigma)(\text{square window}) = (\tfrac{1}{3}^{1/2})(L^2/M^2) \quad (6).$$

However, when $L=(3^{1/2}/2^{1/2})M$, the neighboring squares on the same axis of symmetry are in contact with each other. Therefore, L cannot be increased beyond that limit. In other words, $(1-\sigma)(\text{square window})$ has an upper limit of less than 1. Hence, $$0 \leq (1-\sigma)(\text{square window}) \leq 3^{1/2}/2 = 0.86 \quad (7).$$

In the case of a circular window, the window has an area of $\pi L^2/4$, where L is the diameter of the circle. Therefore, the opening ratio $(1-\sigma)$ is expressed by equation (8).

$$(1-\sigma)(\text{circular window}) = (\pi/2 \cdot 3^{1/2})(L^2/M^2) \quad (8).$$

However, when L=M, the neighboring circles are in contact with one another. Therefore, L cannot be increased beyond that limit. In other words, $(1-\sigma)(\text{circular window})$ has an upper limit of less than 1. Hence, $$0 \leq (1-\sigma)(\text{circular window}) \leq \pi/2 \cdot 3^{1/2} = 0.906 \quad (9).$$

[g. Four-fold Rotationally Symmetrical Pattern (FIGS. 3 and 4)]

In a four-fold rotationally symmetrical pattern, also, the distance between centers of the neighboring windows is denoted by M. The area of the square produced by the centers of the neighboring four windows is expressed as $M^2$. The shape of the window is not limited to a square. A circle, regular hexagon, or equilateral triangle can be used. However, in the case of a regular hexagon or equilateral triangle, although the windows can be formed at the places arranged in four-fold symmetry, the entire pattern cannot be in four-fold symmetry because of the nature of the window shape. FIG. 3 shows a pattern in which the window has the shape of a square; FIG. 4, a circle. In the case of the square window shown in FIG. 3, the symmetry of the arrangement of the windows coincides with the symmetry of the shape of the window. Consequently, when the circumscribed circle of the window has a diameter of $L=2^{1/2}M$, the opening ratio is 1. The ratio L/M determines the opening ratio $(1-\sigma)$ as shown in equation (10).

$$(1-\sigma)(\text{square window}) = L^2/2M^2 \quad (10).$$

The upper limit of the opening ratio is 1. Hence, $$0 \leq (1-\sigma)(\text{square window}) \leq 1 \quad (11).$$

In the case of the circular window shown in FIG. 4, the opening ratio is expressed by equation (12), where L is the diameter of the circle.

$$(1-\sigma)(\text{circular window}) = (\pi/4)(L^2/M^2) \quad (12).$$

When L=M; the neighboring windows are in contact with one another. Therefore, the opening ratio cannot be increased beyond that limit. The opening ratio has an upper limit expressed by equation (13).

$$0 \leq (1-\sigma)(\text{circular window}) \leq 0.785 \quad (13).$$

[h. Thickness d of the Thin-film Electrode]

As described earlier, conventionally, an electrode having a uniform thickness of 20 nm covers the entire surface of the p-type contact layer. The transmittance at a thickness of 20 nm is about 50%. This means nearly half of the light is absorbed uselessly. If the thickness is decreased to less than 20 nm, whereas the amount of the absorption is decreased, the electrical resistance. This increase in resistance extremely decreases the current from the bonding electrode to the semi-transparent thin-film electrode. Therefore, the thin-film electrode must have a thickness of at least 10 nm.

In terms of the production process, it is difficult to produce a thin-film electrode having a thickness of less than 10 nm.

Even in the covering portion composed of the thin metal film, it is desirable that the metal film has a transmittance of about 10%. This requirement determines the upper limit of the thickness. Au is an excellent material because it has low electrical resistivity and provides ohmic contact with a p-type contact layer. Depending on the production method, when an Au film has a thickness is 20 nm, a highly conductive film can be produced with a resistivity of about $2\times10^{-6}$ Ωcm.

In the present invention, the bonding electrode is directly bonded to the Au thin-film electrode. Consequently, current can be injected sufficiently even when the Au thin-film has a thickness as thin as 10 to 30 nm. Depending on the production method, when the thickness is 20 nm, the Au thin-film has an absorption coefficient of about 50%. When the thickness is reduced to 10 nm, whereas the absorption coefficient is decreased to about 30%, the electrical resistance inevitably increases. When the thickness is reduced to less than 10 nm, the electrical resistance increases to an undesirable extent. On the other hand, the upper limit of the thickness is determined by the necessity of the transmittance at the covering portion. It is desirable that the covering portion has a transmittance of at least 0.1. The transmittance is expressed as $\exp(-\alpha\cdot d)$, where $\alpha$ is the absorption coefficient and d is the thickness. When d=20 nm, the transmittance is 0.5. Therefore, the absorption coefficient $\alpha$ is 0.0346 $nm^{-1}$. The thickness for obtaining the transmittance of 0.1 can be calculated by using the equation $0.1=\exp(-0.0346d)$, and the result is 66 nm. However, the electrical resistivity of a thin film varies considerably with the production method and conditions. Au is relatively stable in this respect and has better reproducibility than any other metals. Considering the foregoing aspects, the upper limit of the thickness is about 60 nm. Hence, $$10 \text{ nm} \leq d \leq 60 \text{ nm} \tag{14}$$

As mentioned above, this is a rough measure. Actually, the resistivity of Au also varies with the production method and conditions. Therefore, the thickness d can be determined such that the covering portion has a transmittance of at least 0.1.

[1. Example 1 (ZnSe White LED having a Honeycomb-structured p-electrode)]

With wide-bandgap semiconductors, it is difficult to obtain a p-type. Even when the p-type is obtained, because of the scarce charge carriers, it is not easy to diffuse the current at the p-type contact layer. ZnSe and GaN are typical examples of these semiconductors. FIG. 1 shows an example of a ZnSe-based white LED to which the present invention is applied. A ZnSe-LED is a blue LED that emits blue light having a wavelength of about 485 nm. However, when the ZnSe substrate is doped with an impurity that becomes a certain type of color center, the blue light generates orange-to-yellow fluorescence (the center wavelength is about 590 nm) at the substrate, and the blue light and the fluorescence are combined to produce white light. Hence, such a ZnSe-LED is called a white LED (see Japanese patent No. 3087742 entitled "white color LED").

Epitaxial growth process was performed by using a molecular-beam epitaxy apparatus equipped with a Zn cell, a $ZnCl_2$ cell, an Se cell, an N radical gun, a Cd cell, an Mg cell, etc. The following layers were formed on an n-type-conductive ZnSe single-crystal substrate 2 by the molecular-beam epitaxial growth method:

(a) an n-type ZnSe buffer layer 3 having a thickness of 1 μm;

(b) an n-type ZnMgSSe cladding layer 4 having a thickness of 0.5 μm;

(c) an ZnCdSe/ZnSe MQW active layer 5;

(d) a p-type ZnMgSSe cladding layer 6 having a thickness of 0.5 μm;

(e) a p-type ZnSe layer 7 having a thickness of 0.2 μm; and (f) a p-type contact layer 8 composed of a p-type (ZnTe/ZnSe) MQW layer and a p-type ZnTe layer, the p-type ZnTe layer having a thickness of 60 nm (although not shown in FIG. 1, the p-type ZnnT layer is formed on the p-type (ZnTe/ZnSe) MQW layer).

The temperature of the substrate during the epitaxial growth was maintained at 275 to 325° C. The growth rate was maintained at about 0.4 to 0.7 μm/hr. Nitrogen (N) was supplied as a p-type impurity from the N radical gun to the surface of the ZnSe substrate. Chlorine was used as an n-type impurity and evaporated from the $ZnCl_2$ cell. This concludes the explanation for the process of the epitaxial growth on the n-type ZnSe wafer.

Subsequently, chemical etching was conducted on the surface of the epitaxially grown wafer such that the peripheral portion of each device is etched excluding the central portion for the light-emitting region-Thus, the p-type ZnSe layer 7 was exposed at the peripheral portion. A bonding electrode 9 composed of Ti/Au for wire bonding was formed on the exposed peripheral portion of the p-type ZnSe layer 7. The bonding electrode 9 was not intended to inject a current directly to the p-type ZnSe layer 7. It was intended to inject the current to the p-type ZnTe layer 7 through the neighboring Au electrode 20. The current flows in order of the bonding electrode 9, the mesh-shaped thin-film metal electrode 20, the p-type ZnTe layer (not shown in FIG. 1), the p-type (ZnTe/ZnSe) MQW layer, and the p-type ZnSe layer 7. If the current flows through the peripheral portion, it accelerates the deterioration. Therefore, the current is not intended to flow through the peripheral portion. The Ti/Au layer (the bonding electrode 9) provided at the peripheral portion is capable of blocking the peripheral current.

Next, a mesh-shaped Au electrode 20 having a honeycomb structure was formed with a thickness of d=20 nm on the entire surface of the light-emitting region (central portion). An n-electrode 10 composed of In or T/Au was formed on the back face of the n-type ZnSe substrate.

After the formation of the electrodes 9 and 10, the epitaxially grown wafer was cut to obtain a multitude of LED chips having the shape of a 400-μm square. FIG. 2 shows a plan view of one of the chips. The bonding electrode 9, formed on the top surface of the chip, is composed of narrow belts at the four sides of the square and a projection at one side (this projected portion is used for wire bonding). The honeycomb-shaped thin-film electrode 20 covers the rest of the top surface. The p-type contact layer underneath the honeycomb-shaped thin-film electrode 20 can be seen through the windows. The current does not flow downward directly from the bonding electrode. Instead, the current flows laterally from the bonding electrode 9 to the thin-film electrode 20, from which the current flows downward. The current flowing in the p-type contact layer diffuses toward the center of the window. The chip was fixed onto a lead frame such that the top surface was the face where the p-type electrode was formed. The lead and the p-electrode (the bonding electrode 9) were connected by wire bonding. Finally, the unit was sealed with a resin to form a bullet-type LED lamp.

As described earlier, the shape of the mesh-shaped electrode is produced by forming a multitude of windows, such as circles, squares, or regular hexagons, at symmetrically arranged places, such as in six-fold symmetry or four-fold symmetry. FIG. 3 shows a mesh-shaped electrode in which square windows are arranged in four-fold symmetry-FIG. 4 shows a mesh-shaped electrode in which circular windows are arranged in four-fold symmetry. The diameter L of the circumscribed circle of the window is designed to be 10 to 40 μm, for example.

The optical output of the LED having the p-electrode structure of the present invention was measured under a constant-current mode. A current of 20 mA produced a highly bright white-light emission with a light intensity of 5 mW. The relationship between the covering ratio σ of the mesh-shaped Au electrode and the emitted-light intensity (axial brightness) Q was measured in the light-emitting region by using various mesh-shaped Au electrodes having a different covering ratio σ. The measured results are shown in FIG. 5. The axis of abscissas represents the covering ratio σ; the axis of ordinates represents the axial brightness Q.

The brightness of a surface-illuminating-type LED varies with an angle. The total brightness is obtained by placing the LED at the focal point of an integrating sphere. All the emitted light beams are collected after they are reflected by the sphere, and the intensity is measured. On the other hand, the axial brightness is obtained by measuring the optical output of the LED with an instrument placed on the normal of the plane of the LED. In other words, the axial brightness is the power of the light emitted to a specified direction. The axial brightness is roughly proportional to the total brightness. Because the axial brightness is easier in measuring, the axial brightness is measured for the comparison in this example.

The measured results confirmed that as the covering ratio σ of the metal electrode decreases, the emitted-light intensity (axial brightness) Q increases. The following data are average values obtained by measuring the brightness on a multitude of samples having a predetermined covering ratio: when σ=1, Q=1,
when σ=0.69 (L=40 μm), Q=1.16,
when σ=0.61 (L=40 μm), Q=1.23,
when σ=0.49 (L=40 μm), Q=1.35, and
when σ=0.49 (L=20 μm), Q=1.36.

The conventional LED has a structure in which the entire surface of the p-type contact layer is covered with a semi-transparent metal electrode (Au electrode). This structure corresponds to σ=1. This condition is taken as a reference, and the axial brightness at σ=1 is referred to as 1. The graph of brightness shown in FIG. 5 is plotted using this reference value. When the covering ratio σ is 0.69 (the opening ratio is 0.31), the optical output increases by a factor of 1.16. When the covering ratio σ is 0.61 (the opening ratio is 0.39), the optical output increases by a factor of 1.23. When the covering ratio σ is 0.49 and L=40 μm, the optical output increases by a factor of no less than 1.35. Similarly, when the covering ratio σ is 0.49 and L=20 μm, the optical output increases by a factor of no less than 1.36. These data clearly demonstrate the advantage of providing the opening portion in the metal electrode.

The above data can be used to roughly determine the term $\gamma(L)/\beta(d)$ in equation (3). The above data were substituted into equation (3) to obtain the average value of $\gamma(L)/\beta(d)$. The result is expressed by equation (15).

$$\gamma(L)/\beta(d)=1.6 \qquad (15).$$

The electrode thickness d is 20 nm. When the transmittance $\beta(d)$ is 0.5, the diffusion power $\gamma(L)$ is about 0.8. The axial brightness Q has little difference between L=40 μm and L=20 μm. This means that when L has a value of 40 μm or less, the p-type contact layer has the ability to diffuse the current sufficiently.

[2. Example 2 (GaN-based Blue LED having a Honeycomb-structured p-electrode)]

GaN is another example in which the p-type layer comes to have high resistance and therefore makes it difficult to diffuse current. FIG. 6 shows an example of a GaN-based blue LED to which the present invention is applied. The following layers were formed on a sapphire substrate 22 by the metalorganic chemical vapor deposition (MO-CVD) method:

(a) a GaN buffer layer 23 having a thickness of 30 nm, (b) an n-type GaN cladding layer 24 having a thickness of 4 μm, (c) an InGaN active layer 25, (d) a p-type AlGaN cladding layer 26 having a thickness of 0.1 μm, and (e) a p-type GaN layer 27 having a thickness of 0.3 μm.

Subsequently, as shown in FIG. 6, dry etching was conducted at a corner portion to expose the n-type GaN cladding layer 24, excluding the central portion for the light-emitting region. An n-type metal electrode 30 composed of Ti/Au was formed on the surface of the exposed part of the n-type GaN cladding layer 24. Then, a bonding electrode 28 for wire bonding was formed on the foregoing light-emitting region. The rest of the light-emitting region was covered with a thin-film metal electrode 29 being composed of Ni/Au, having a thickness of 20 nm, and having a honeycomb structure.

After the formation of the electrodes, the epitaxially grown wafer was cut to obtain chips having the shape of a 300-μm square. FIG. 7 shows a plan view of one of the chips. The n-electrode 30 composed of Ti/Au was placed on the lower stage of the chip at the lower right portion of FIG. 7. The bonding electrode 28 was placed at the upper left portion of the upper stage. The light-emitting region was covered with the mesh-shaped p-electrode 29 composed of Ni/Au. The p-GaN layer 27 can be seen through the windows of the mesh-shaped electrode. The chip was fixed onto a lead frame. The lead and the bonding electrode were connected by wire bonding. Finally, the unit was encapsulated with an epoxy resin to form a bullet-type LED lamp.

The optical output of the LED of Example 2 was measured under a constant-current mode. A current of 20 mA produced a highly bright blue-light emission with a light intensity of no less than 4 mW. Under this condition, the forward voltage was 3.6 V.

What is claimed is:

1. A structure of a p-electrode formed at the light-emerging side of a light-emitting diode (LED), the LED comprising:

(a) an n-type semiconductor substrate;

(b) an n-type cladding layer formed over the n-type semiconductor substrate;

(c) an active layer formed on the n-type cladding layer;

(d) a p-type cladding layer formed on the active layer;

(e) a p-type contact layer formed over the p-type cladding layer, with a p-type semiconductor layer between the p-type cladding layer and the p-type contact layer; and (f) an n-electrode formed on the back face of the n-type semiconductor substrate; the structure comprising:

(g) a mesh-shaped semi-transparent thin-film metal electrode for diffusing electric current formed on the p-type contact layer, the metal electrode having:

(g1) a covering portion having a transmittance of at least 10%; and (g2) an opening portion being formed of a multitude of windows and having an opening ratio of at least 20%; and (h) a bonding electrode for wire bonding, the bonding electrode being:
  (h1) formed at the periphery of the p-type contact layer; and
  (h2) bonded directly to the mesh-shaped semi-transparent thin-film metal electrode.

2. A structure as defined by claim 1, wherein the LED further comprises an n-type buffer layer between the n-type semiconductor substrate and the n-type cladding layer.

3. A structure as defined by claim 2, wherein:
  (a) the n-type semiconductor substrate is an n-type ZnSe substrate;
  (b) the n-type buffer layer is an n-ZnSe buffer layer;
  (c) the n-type cladding layer is an n-ZnMgSSe cladding layer;
  (d) the active layer is one member selected from the group consisting of a ZnCdSe/ZnSe multiple quantum well (MQW) active layer and a ZnSeTe active layer;
  (e) the p-type cladding layer is a p-ZnMgSSe cladding layer; and
  (f) the p-type contact layer comprises a p-(ZnTe/ZnSe) MQW layer and a p-ZnTe layer formed on the p-(ZnTe/ZnSe) MQW layer.

4. A structure as defined by claim 3, wherein:
the p-type semiconductor layer is a p-ZnSe layer.

5. A structure as defined by claim 2, wherein:
  (a) the n-type semiconductor substrate is an n-GaN substrate;
  (b) the n-type buffer layer is an n-GaN buffer layer;
  (c) the n-type cladding layer is an n-GaN cladding layer;
  (d) the active layer is an InGaN active layer;
  (e) the p-type cladding layer is a p-AlGaN cladding layer; and
  (f) the p-type contact layer is a p-GaN contact layer.

6. A structure as defined by claim 5, wherein:
the p-type semiconductor layer is a p-GaN layer.

7. A structure as defined by claim 1, wherein:
  (a) the n-type semiconductor substrate is an n-GaN substrate;
  (b) the n-type cladding layer is an n-GaN cladding layer;
  (c) the active layer is an InGaN active layer;
  (d) the p-type cladding layer is a p-AlGaN cladding layer; and
  (e) the p-type contact layer is a p-GaN contact layer.

8. A structure as defined by claim 1, wherein the circumscribed circle of each window of the opening portion in the mesh-shaped semi-transparent thin-film metal electrode has a diameter, L, of at most 100 $\mu$m.

9. A structure as defined by claim 1, wherein the covering portion of the mesh-shaped semi-transparent thin-film metal electrode has a thickness, d, of at least 10 nm and at most 60 nm.

10. A structure as defined by claim 1, wherein the opening portion of the mesh-shaped semi-transparent thin-film metal electrode has an opening ratio of 30% to 90%.

* * * * *